(12) United States Patent
Gajjewar et al.

(10) Patent No.: US 8,582,389 B2
(45) Date of Patent: Nov. 12, 2013

(54) WRITE ASSIST IN A DUAL WRITE LINE SEMICONDUCTOR MEMORY

(75) Inventors: Hemangi Umakant Gajjewar, Sunnyvale, CA (US); Sachin Satish Idgunji, San Jose, CA (US); Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 223 days.

(21) Appl. No.: 13/067,629

(22) Filed: Jun. 15, 2011

(65) Prior Publication Data

US 2012/0320694 A1     Dec. 20, 2012

(51) Int. Cl.
  *G11C 7/12*     (2006.01)
(52) U.S. Cl.
  USPC .............................. 365/230.05; 365/189.04
(58) Field of Classification Search
  USPC .................. 365/189.04, 189.14, 189.16, 154, 365/230.05; 711/149
  See application file for complete search history.

(56) References Cited

U.S. PATENT DOCUMENTS

| | | | | |
|---|---|---|---|---|
| 4,802,122 | A * | 1/1989 | Auvinen et al. | 365/154 |
| 5,477,489 | A * | 12/1995 | Wiedmann | 365/189.04 |
| 2003/0076731 | A1* | 4/2003 | Terada | 365/230.05 |
| 2006/0126420 | A1* | 6/2006 | Kurumada et al. | 365/230.05 |
| 2009/0129194 | A1* | 5/2009 | New et al. | 365/230.05 |
| 2012/0243285 | A1* | 9/2012 | Ngu et al. | 365/63 |

OTHER PUBLICATIONS

Nii et al., "A 45-nm Single-port and Dual-port SRAM family with Robust Read/Write Stabilizing Circuitry under DVFS Environment", *2008 IEEE—Symposium on VLSI Circuits*, pp. 212-213.
Singh et al., "A 2-Port 6T SRAM Bitcell Design with Multi-Port Capabilities at Reduced Area Overheard", *2010 CROWN—11th Int'l Symposium on Quality Electronic Design*, 8 pages.
Agarwal et al., "A 32nm 8.3GHz 64-entry × 32b Variation Tolerant Near-Threshold Voltage Register File", *2010 IEEE—Symposium on VLSI Circuits*, pp. 105-106.
Ishii et al., "A 28-nm dual-port SRAM macro with active bitline equalizing circuitry against write disturb issue", *2010 IEEE—Symposium on VLSI Circuits*, pp. 99-100.

* cited by examiner

*Primary Examiner* — Douglas King
(74) *Attorney, Agent, or Firm* — Nixon & Vanderhye P.C.

(57) ABSTRACT

A semiconductor memory storage device with a plurality of storage cells, each cell includes two access control devices, each providing the cell with access to or isolation from a respective one of two data lines in response to an access control signal provided by access control circuitry. The control devices are controlled to provide the storage cell with access to or isolation from either of the first and second of the two data lines. The access control circuitry is responsive to a data access request, the data access request being a write request, to apply a data value to be written to both of the first and second data lines and to apply the access control signal to both of the first and second access control lines.

17 Claims, 7 Drawing Sheets

WRITE ASSIST IN A DUAL WRITE LINE SEMICONDUCTOR MEMORY

BACKGROUND OF THE INVENTION

1. Field of the Invention

The field of the invention relates to the field of data storage and in particular, to the storage and access of data in semiconductor memories.

2. Description of the Prior Art

With ever increasing demands to reduce both the size of devices and their power consumption, it is becoming increasingly challenging to design robust semiconductor memories such as SRAM. Each storage cell in an SRAM comprises a feedback loop for holding a data value. In order to write to the feedback loop and store a new value, the input data value must have a high enough voltage level to be able to switch the state stored by the feedback loop if required, while reading from the feedback loop should be performed without disturbing the values stored in any of the feedback loops.

SRAM bit cells are generally designed to be small and can conventionally be built from 6 transistors. However, dual port cells are also known that are built from 8 transistors. These are conventionally used in conjunction with two word lines and two bit lines, and have two sets of access transistors, one for connecting a first word line and set of bit lines to the feedback loop and the other for connecting a second word line and set of bit lines to the feedback loop. These dual port bit cells allow two cells to be accessed in the same cycle by the use of these different ports and access lines. Clearly care must be taken not to try to read and write to the same cell in the same cycle.

When accessing a bit cell in such memories there is generally a precharge phase during which both bit lines are pre-charged and then there is an evaluation phase where access transistors are turned on and either the value stored in the cell is transferred to the bit lines, or a value to be written to the cell is transferred to the bit lines and is then transferred to the cell via the access transistors. In a write the data value is placed on the bit lines by driving the complementary bit lines to the required voltage the access transistors are turned on and the feedback loop is connected to the bit lines and the data value on the bit lines is stored in the feedback loop. When reading from a cell both bit lines are pre-charged and the side of the cell storing a 0 will pull down the bit line when it is connected to it and this change in voltage level can be detected to determine on which side of the feedback loop the 0 is stored. However, the difference in voltage levels between the pre-charged bit line and the 0 may result in the node storing a 0 being pulled up towards 1 resulting in instability in the bit cell and the bit cell flipping value. This is called read disturb and can happen to a cell during a read to a cell or during a write to another cell on the same word line. In the latter case the word line is activated to access the cell being written to, which affects other cells connected to the word line.

As dimensions scale down the variations in device properties due to random dopant fluctuations, line edge roughness etc. increase drastically thereby causing an increase in the rate of read disturbs as well as reduced write margins, with smaller scale geometries.

Thus, designing a robust SRAM where cells can be read (without read disturb) and written to across all operational voltage ranges turns out to be difficult. Reducing the voltage at which the SRAM cells can be read and written to successfully is not easy and in particular as the voltage scales down it becomes increasingly difficult to write to the cells. Write assist mechanisms that increase the voltage on the word line during a write to improve access are known but such techniques have the disadvantage of increasing the probability of a read disturb to a cell on the same row as the cell being accessed and require the provision of an additional higher voltage level.

It would be desirable to be able to reduce write failures of a semiconductor memory without unduly increasing the read failures.

SUMMARY OF THE INVENTION

A first aspect of the present invention provides a semiconductor memory storage device for storing data comprising: a plurality of storage cells, each storage cell comprising at least two access control devices, each of said access control devices providing said storage cell with access to or isolation from a respective one of two data lines in response to an access control signal, said two data lines being connected to at least one data port; access control circuitry for applying said access control signal via at least one of two access control lines to control a plurality of said access control devices; wherein at least one of said at least two access control devices of each storage cell is controlled by said access control signal transmitted along a first of said two access control lines to provide said storage cell with access to or isolation from a first of said two data lines, and at least one further of said at least two access control devices is controlled by said access control signal transmitted along a second of said two access control lines to provide said storage cell with access to or isolation from a second of said two data lines; said access control circuitry being responsive to at least one data access request, said at least one data access request comprising a write request, to apply a data value to be written to both of said data lines via the data port and to apply said access control signal to said first and to said second said two access control lines.

The present invention recognises the difficulties of being able to write successfully to a cell when it may be operating at ever lower voltages, higher speeds and smaller topologies. It addresses this problem by configuring a cell to have two data lines and two access control lines, in a similar way to a dual port storage device, but rather than using the two independently it uses them together to write one value to a cell. This arrangement is analogous to increasing the width of the first access control device of the cell being written to and allows the charge to be transferred more effectively to the cell, thereby increasing the probability of the write being successful. Furthermore, there is no need to provide an increased voltage to an access control line, rather the two access control lines simply have the same signal applied to them to allow access to two data lines holding the same data value.

The system thus, operates without complicated control or any additional delay so that the performance of the cell is maintained and the write success is improved. There is however, an increase in area associated with this solution.

In some embodiments said access control circuitry is responsive to said write request to apply said access control signal to said first of said two access control lines and after a predetermined time delay to apply said access control signal to said second of said two access control lines.

When accessing a cell by connecting it to one or more data lines, the amount of current over a small transition time that results from the storage cell being connected to the data lines can result in charge being injected into the storage cell which is sufficient to overcome the stability of the feedback loop in the storage cell. The larger the charge injected, the higher the probability of the storage cell being disturbed and losing its stored value. This is desirable in a write, but can lead to associated cells that are not being written to having their stored values corrupted.

Thus, this embodiment of the present invention is concerned with writing successfully to a cell without unduly increasing the probability of associated cells having their stored data value disturbed. In order to address this problem it recognises that the additional access control device that provides access to the additional data line could be controlled to provide this access with a delay compared to access to the first data line. In this way, for the data lines that are not being driven, i.e. for the cells that are not being written to but that are located on the same access control lines, the charge on the additional data line will have decayed at least partially by the time the additional data line is connected to these cells and there is therefore less charge injected and less chance of the stored value being corrupted. However, for the cell being written, the data lines are being driven and therefore its charge does not decay and thus, when the access control device connects it to the storage cell the same amount of charge is injected into the cell.

By connecting the first data line without a delay the cell may be written to successfully without a delay, however, in the case that the write is not successful, then the later connection of the additional data line increases the probability that the write will be successful albeit with a slight delay.

In some embodiments, said data lines are precharged to a predetermined voltage prior to said access control signal being applied, said predetermined time delay being selected in dependence upon a target read stability yield of said memory.

The amount of time delay between the first access control signal and the second access control signal can be selected depending on the characteristics of the memory. A longer time delay will reduce the probability of read disturb occurring in the cells that have been accessed but are not being written to, but will also increase the write time and therefore reduce the performance of the memory. Thus, depending on the characteristics of the memory the desired read stability yield and the acceptable write failure of the memory a certain predetermined time can be selected. This time may be selected as an absolute time or it may be selected as in this embodiment in terms of the desired read stability.

In some embodiments, the semiconductor memory comprises a mode indicator signal input for receiving a mode indicator indicating a mode of operation for the semiconductor memory storage device to operate in.

Some of the semiconductor memory storage devices may operate in a plurality of modes. As noted previously the design of the cells is similar to a dual port cell where both ports are used to assist a write. The memory may however be configured to operate in different modes, such that in some modes, it operates in a single port mode and writes are assisted while in other modes the two data lines may operate independently of each other and the memory operates as a dual port memory. It may also be configured in some embodiments to always operate in a single port mode but in some instances only one of the data lines will be used and the other will not be pre-charged in order to save power.

In some embodiments, the semiconductor memory storage device comprises switching circuitry for connecting said two data lines to a same data port, said switching device being responsive to receipt of a first mode indicator and a write request to connect said two data lines to said same data port and being responsive to receipt of at least one of a read request and a second mode indicator to isolate said second data line from said same data port.

In order to achieve the multiple mode operation the device may be configured with switching circuitry controlled by the mode indicator to connect or isolate the two data lines such that in a first mode and in response to a write request the two data lines are connected to a same data port, while in response to a read request or a second mode indicator the second data line is isolated from this data port. Having two data lines that are pre-charged can assist in a write operation. However, during a read such assistance is not required. Thus, there is no advantage in using both data lines in a read and generally they are not used. The mode indicator can also be used to select whether or not to use the additional data line in other instances such as for example where the voltage levels powering the memory are high and the extra assist in the write may not be required. In such a circumstance the mode indicator may indicate this and control the switch to isolate the additional data line such that it is not used.

In some embodiments, in response to at least one of said read request and said second mode indicator said semiconductor memory storage device is configured not to precharge said second data line and said access control circuitry is configured not to apply said access control signal to said second access control line.

As noted in some cases it may not be advantageous to use the second data line, in such cases then this data line need not be precharged and furthermore the access control signal should not be applied to the second access control line. Precharging an additional data line increase power consumption, thus, being able to selectively not precharge it when it is not required is advantageous. One area where the selective use of the second data line could be implemented is at low voltage operations. For higher voltage operations, where the write is more robust (probability of write fails is low), the second data line could be turned off through a power gating mechanism and the second word line (access control) could be deasserted throughout the high voltage operation mode. When the memory is operated at lower voltage, the second data line can be asserted to provide additional assist during the write operations In some embodiments, the semiconductor memory storage device comprises switching circuitry for connecting said two data lines to a same data port in response to a single port mode indicator and a write request and to connect said two data lines to two independent data ports in response to at least one of a dual port mode indicator and a read request.

In some embodiments the semiconductor memory storage device may be configured to operate in dual port mode in some circumstances. In dual port mode the two data lines can be connected independently to two data ports and data can be input to the storage cell from either of these ports. This allows different data values to be written to cells in the same column. In modes of operation where writes might be failing often, for example where the voltage level across the circuit has dropped for some reason then this dual port mode may be suppressed in write mode by using a single port mode indicator and at this point the second port is used for assisting the write and the same data value is loaded on both data lines and the access control device is connected to both data lines for the storage cell thereby improving the probability of the write succeeding.

In some embodiments, at least one of said two data lines are precharged to a predetermined voltage prior to said access control circuitry applying said access control signal.

When accessing the storage cells the data lines are generally precharged prior to the access. It may be that both are precharged or it may in some cases be only one that is precharged.

In some embodiments, said second data line is precharged to a lower predetermined voltage than a predetermined voltage that said first data line is precharged to, said lower predetermined voltage being selected in dependence upon a desired read stability of said memory.

It may be advantageous if the second data line is in some cases precharged to a lower predetermined voltage than the voltage that the first data line is precharged to. In the case that the second data line is being connected to the cell in response to a write assist signal then in order to impede read disturb on the selected cells that are not being written to the predetermined voltage that the secondary data line is precharged to can be reduced. The data lines of the cell being written to are driven, thus, once the data value is applied the voltage on them will attain the predetermined level corresponding to the data value. Thus, the cell being written to will see the predetermined voltage while the cell not being written to will see the lower precharge voltage and will therefore be less likely to have its stored value disturbed. This reduced voltage can be selected in conjunction with the time delay so that a suitable voltage to assist the write and impede read disturb can be selected along with a suitable time delay. It should be noted that the time penalty associated with accessing the cell in response to the write assist signal on the second access control line is dependent on the voltage level on the second data line and this needs to be considered when selecting a suitable precharge voltage level for the second data line. The time delay and voltage levels can be selected in conjunction with each other. Typically the reduced voltage should be selected in dependence on a desired read stability yield of the memory while also taking into consideration the potential time penalty.

In some embodiments, said at least one access control device providing access to said first data line is larger than said at least one access control device providing access to said second data line.

It may be advantageous to have a storage cell that is skewed with one access control device that is larger than another. In the case that the storage devices are configured as single port storage devices with the second data line being used simply as a write assist data line then it may be advantageous if the access control device that provides access to this data line is smaller than the access control device providing access to the primary data line. The primary data line will be used for all data accesses including reads, while the secondary data line will only be used in the case that write assist is needed. Thus, this access device is not so important for performance and providing a smaller device will decrease the size of the cell but will not have a large effect on performance.

In some embodiments, said at least one access control device providing access to said first data line is between 5 and 50% larger than said at least one access control device providing access to said second data line.

The amount that the access control devices differ in size depends on the design but in many cases it may be advantageous if the primary access control device is between 5 and 50% larger than the secondary access control device.

In some embodiments, said access control circuitry is responsive to said access control request comprising a read request to apply said read request to said at least one access control device providing access to said first data line and not to apply said read request to said at least one access control device providing access to said second data line.

In the case where you are using skewed storage cells then it is advantageous if the larger access control device is used for the read requests.

In some embodiments, each storage cell comprises a feedback loop and at least four access control devices, at least two of said at least four access control devices providing one side of said feedback loop with access to or isolation from a respective one of two data lines and at least two further of said at least four access control devices providing the other side of said feedback loop with access to or isolation from a respective one of two corresponding complementary data lines, said two data lines being connected to at least one data port and said two complementary data lines being connected to at least one complementary data port; at least two of said at least four access control devices of each storage cell is controlled by said access control signal applied to a first of said two access control lines to provide said storage cell with access to or isolation from a first of said two data lines and a corresponding first of said two complementary data lines, and at least two further of said at least four access control devices is controlled by said access control signal applied to a second of said two access control lines to provide said storage cell with access to or isolation from a second of said two data lines and a corresponding second of said two complementary data lines.

The semiconductor memory storage device may be a storage device having data lines and complimentary data lines with access devices on either side of a feedback loop providing access to each of the data lines and complimentary data lines.

In some embodiments, said plurality of storage cells are arranged in at least one array comprising a plurality of rows, a corresponding plurality of two access control lines, a plurality of columns and a corresponding plurality of two data lines and two complementary data lines.

The memory may well be arranged in an array, with the access control lines corresponding to word lines and the data lines corresponding to bit lines.

A second aspect of the present invention provides a method of storing data in a storage cell within a semiconductor memory storage device comprising the following steps: receiving a write request to write a data value; applying said data value to two data lines; applying an access control signal to a first of two access control lines to control a plurality of access control devices connected to said first of said two access control lines to each provide an associated storage cell with access to a first of said two data lines; and applying said access control signal to said second of said two access control lines to control a plurality of access control devices connected to said second of said two access control lines to each provide an associated storage cell with access to a second of said two data lines.

A third aspect of the present invention provides a data storage cell for storing a data item comprising: a feedback loop for storing said data item; at least two access control devices, each of said access control devices being configured for providing said feedback loop with access to or isolation from a respective one of two data lines in response to an access control signal; at least two inputs for receiving said access control signal at least one of said at least two access control devices being controlled by said access control signal received at a first of said two inputs, and at least one further of said at least two access control devices is controlled by said access control signal received at a second of said two inputs; wherein said at least one of said access control devices controlled by said access control signal received at said first input being between 5 and 50% larger than said at least one of said access control devices controlled by said access control signal received at said second input.

A bit cell which has access control devices that provide access to one data line that are larger than the access control devices providing access to another data line can be advantageous where the secondary data line is simply used as a write assist data line and the primary data line is used both for read and write. Thus, it may be advantageous to design such cells with one access control device that is larger than the other as this access control device has more effect on performance than the other access control device.

A fourth aspect of the present invention provides a computer program product comprising a computer program which when executed on a computer causes said computer to generate a layout for a memory according to a first aspect of the present invention.

A fifth aspect of the present invention provides a computer program product comprising a computer program which when executed on a program causes said program to generate a layout for a storage cell, said storage cell comprising: a feedback loop; at least two access control devices, each of said access control devices being configured for providing said feedback loop with access to or isolation from a respective one of two data lines in response to an access control signal; at least two inputs for receiving an access control signal at least one of said at least two access control devices being controlled by said access control signal received at a first of said two inputs, and at least one further of said at least two access control devices is controlled by said access control signal received at a second of said two inputs; wherein said at least one of said access control devices controlled by said access control signal received at said first input is larger than said at least one of said access control devices controlled by said access control signal received at said second input.

A sixth aspect of the present invention provides a semiconductor memory means for storing data comprising: a plurality of storage cell means for storing data items, each storage cell means comprising at least two means for providing access, each of said means for providing access providing said storage cell means with access to or isolation from a respective one of two data lines in response to an access control signal, said two data lines being connected to at least one data port; access control means for applying said access control signal via at least one of two access control lines to control a plurality of said means for providing access; wherein at least one of said at least two means for providing access of each storage cell means is controlled by said access control signal received from a first of said two access control lines to provide said storage cell means with access to or isolation from a first of said two data lines, and at least one further of said at least two means for providing access is controlled by said access control signal received from a second of said two access control lines to provide said storage cell means with access to or isolation from a second of said two data lines; said access control means being responsive to at least one data access request, said at least one data access request being a write request, for applying a data value to be written to both of said first and second data lines and to apply said access control signal to both of said first and second access control lines.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
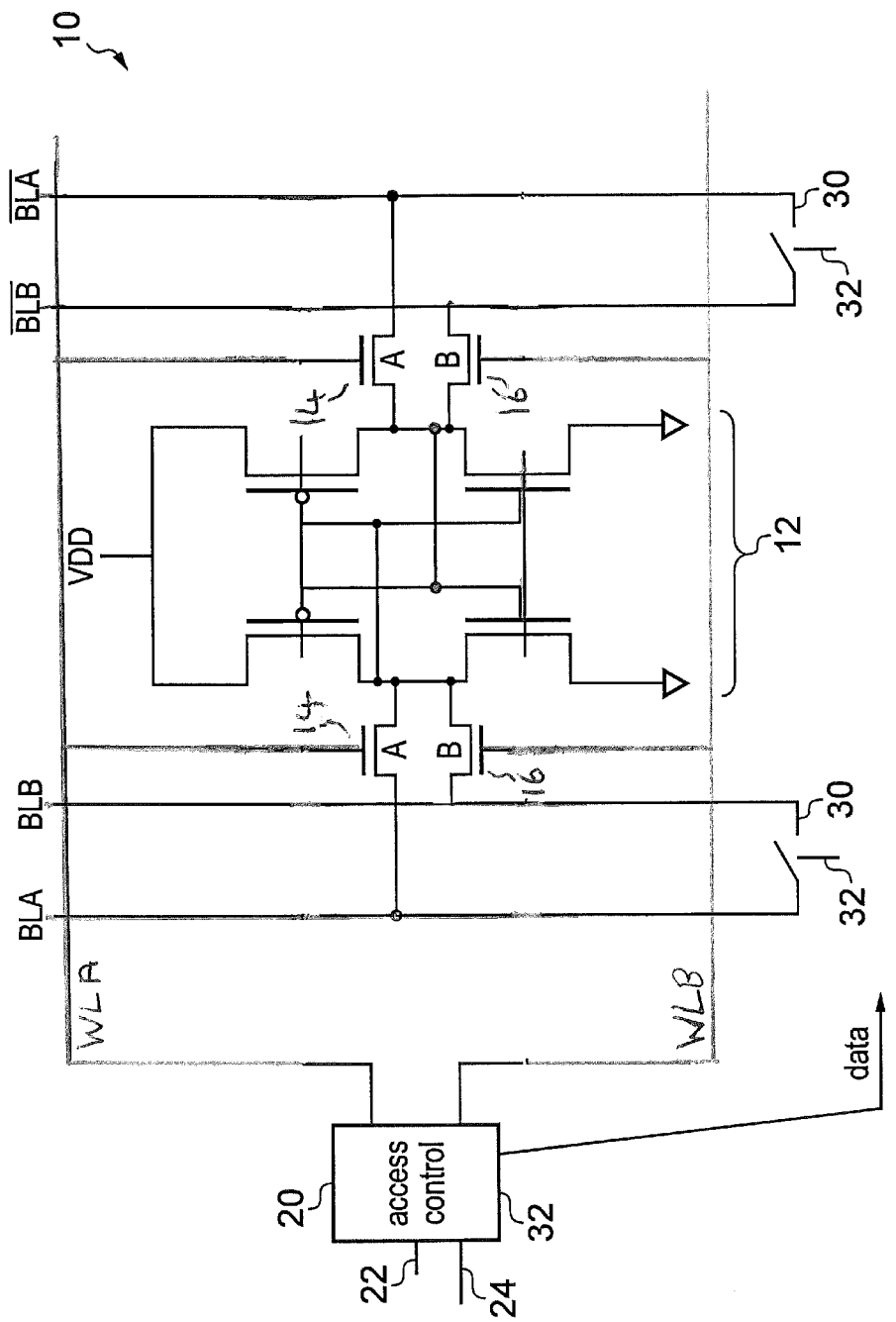
FIG. 1 shows a storage cell according to an embodiment of the present invention.

FIG. 1 shows a storage cell 10 in a memory comprising a feedback loop 12 for storing a data value and two sets of access transistors 14 and 16.

Access transistors 14 provide access to bit line and complimentary bit line A and are controlled by word line A while access transistors 16 provide access to bit line and complimentary bit line B and are controlled by word line B. The memory also comprises access control circuitry 20 which generates the access control signals and applies them to the word lines in response to an access request received at input 22.

Storage cell 10 is configured in a similar way to a conventional dual port storage cell but is configured with access control circuitry 20 and switching circuitry 30 that allows it to operate in a single port mode with the secondary data lines BLB and word line WLB being used to increase the writeability of the cell rather than to provide an additional data port. It may be configured to operate in this mode for all write requests or it may have a mode indicator 32 which is used to trigger this additional write assist mode in for example modes of operation where the operating voltage has fallen below a predetermined level and writes have started to fail.

Switching circuitry 30 is configured to connect the respective bit lines A and B and complementary bit lines A and B together in these write assist modes in response to a write request. Thus, in response to a mode signal 32 indicating write assist mode and to receipt of a write request at input 22 the switching circuitry 30 connects the bit lines together and access control circuitry 20 applies the write request to both word lines WLA and WLB.

If the write assist mode is not activated then when a write request is received at input 22 switches 30 are open and during the precharge phase only the bit line A and complimentary bit line A are precharged. The data value is then written to these bit lines and word line A is activated and the devices 14 are switched on. This provides storage cell 12 with access to the bit lines A and the data value held on these bit lines is then written to storage cell 12. This mode has been selected perhaps because the operating voltage levels are sufficient to switch the value stored in the cell and the cell is therefore successfully written.

In write assist mode, in response to a mode signal at 32 the switches 30 are closed and during the precharge mode both bit lines A and bit lines B and complimentary bit lines A and B are precharged. Then word line A is activated and the access transistors 14 are switched on and storage cell 12 is connected to bit line and complimentary bit line A. After a slight delay access control circuitry 20 activates world line B and transistors 16 are switched on and bit line B and complimentary bit line B are connected to storage cell 12. This results in additional charge being injected into the cell and even if the voltage levels are low data may be successfully written to storage cell 12. Other storage cells on these word lines will also receive the access signal sent along word line A and word line B and their access devices 14 and 16 will switch on in response to these signals. However, in their cases although the bit lines will have been precharged there will be no data value held on them and thus, by the time access devices 16 are switched on the charge held on bit lines B and complimentary bit line B will have decayed somewhat and thus, the charge injected into the cell will not be high. This means that the additional charge injected into the cell by the use of these additional access devices is low and the chances of these cells having the value stored in them disturbed is also correspondingly low.

There is in this embodiment a further input 24 to access control circuitry 20 that provides a signal to the access control circuitry indicating a length of the time delay between firing word line A and word line B in a write access. This input may be a user input port to allowing a user to amend the time delay. For example, a user may decide that the read stability yield of the memory is higher than required and the user would prefer the memory to have a higher performance and thus, in this case a user can insert a value which indicates to the access control circuitry 32 that it should reduce the delay by a certain amount. Alternatively, the user may require a higher read stability yield and thus, may provide data via input 24 which indicates that the delay should be increased.

The input 24 may alternatively in other embodiments be connected to detection circuitry for detecting characteristics of the memory such as circuitry that track the process variations in the memory such that the performance of a particular memory can be determined and a suitable delay to provide the desired read stability yield for that memory calculated and then input to access control circuitry via input 24.

Thus, the device according to the embodiment of FIG. 1 provides increased success in writability without unduly increasing the probability of disturbing cells not being written to.

Furthermore, in some high voltage operation modes and during reads only bit line and complimentary bit line A are precharged and thus, the power required to precharge bit line and complimentary bit line B is not used making the device more efficient.

Although in the description outlined above there was a delay provided between firing word line A and word line B, in some embodiments they may be fired at the same time. Firing them at the same time will increase the probability of the write succeeding but will also increase the probability of a read disturb. Providing a delay will decrease the probability of a read disturb but will delay the write and therefore affect performance. Thus, whether or not to provide a delay and indeed the length of the delay is selected depending on desired performance and memory characteristics.

Figure 2:
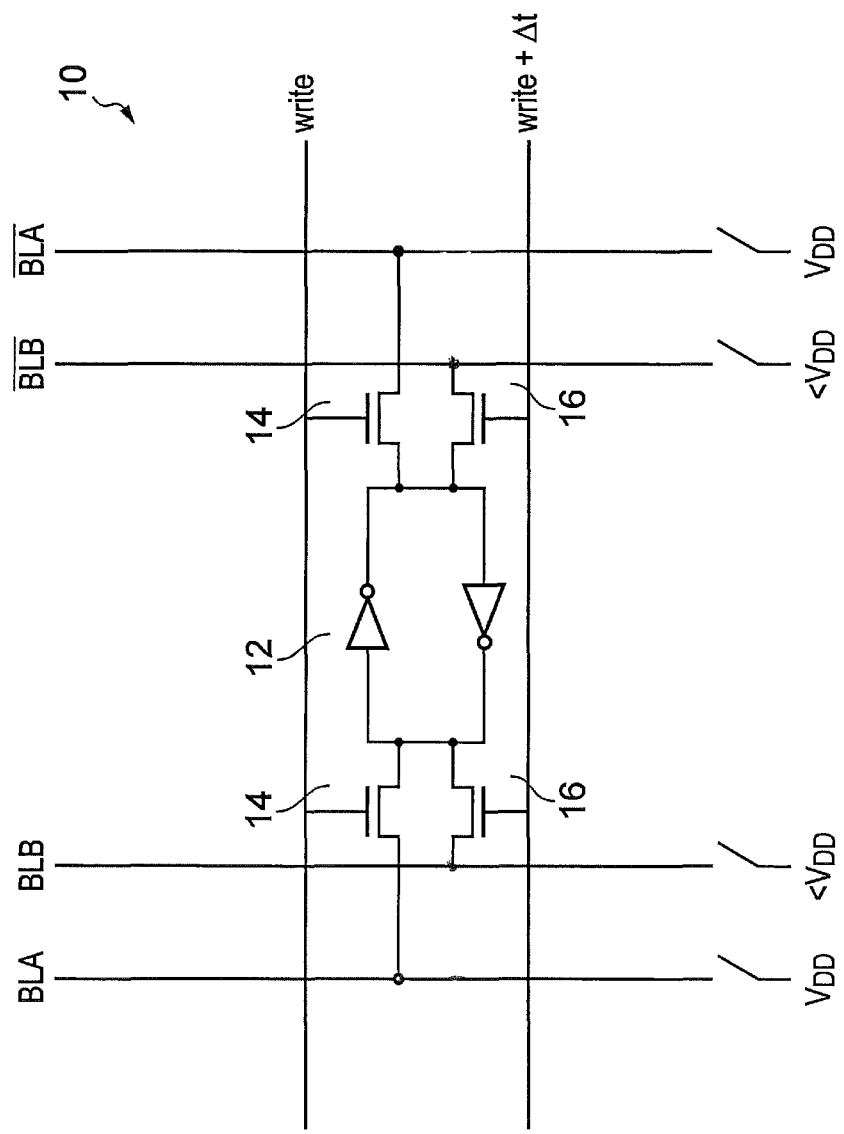
FIG. 2 shows an asymmetric single port storage cell according to an embodiment of the present invention.

FIG. 2 shows a storage device 10 similar to that shown in FIG. 1 but with some additional advantageous features. In this device access control devices 14 are significantly larger than access control devices 16. Furthermore the voltage that the additional bit line, bit line B and complimentary bit line B are charged to is in this embodiment less than the voltage that the main bit line and complimentary bit lines A are charged to.

As noted previously the access transistors 16 are used to improve writeability and are not used in some modes or in reads. Thus, if they are the same size as the access transistors 14 they will significantly increase the size of the storage cell 10 but will not in general increase performance. Using smaller devices means that the size of the storage cell is not increased unduly and yet the additional functionality of these devices is still provided.

Furthermore, decreasing the voltage level on these secondary data lines means that the amount of charge lost through precharging them is reduced and the charge injected into selected cells that are not being written to is reduced. The cells that are being written to will have the data values applied to the bit lines following precharge and will therefore have the source voltage applied to them at this point. As in some embodiments there is a delay before connecting these data lines to the cell in any case, the delay caused by the voltage level needing to rise from lower levels to the source level once the data value is applied may not affect the device. In this example a reduced voltage level of a half is given. The actual size would be selected in conjunction with the time delay depending on desired memory properties and memory characteristics and may well depend on the desired read stability yield of the memory. It should be noted that if the voltage level provided is too low then it may get too close to a logical 0 value and this can itself corrupt the non-written-to cells thus, careful selection of this value is required. In some embodiments it may be between 65 and 80% of the value of the source voltage level.

With regard to the different size of pass gates, this would also affect the capacitance of the data lines connected to these pass gates and thus, the charge they would hold following precharge. The smaller devices will have a lower capacitance and will therefore hold less charge, thus the charge held on the second bit line will decay more quickly where smaller access devices are used.

Figure 3:
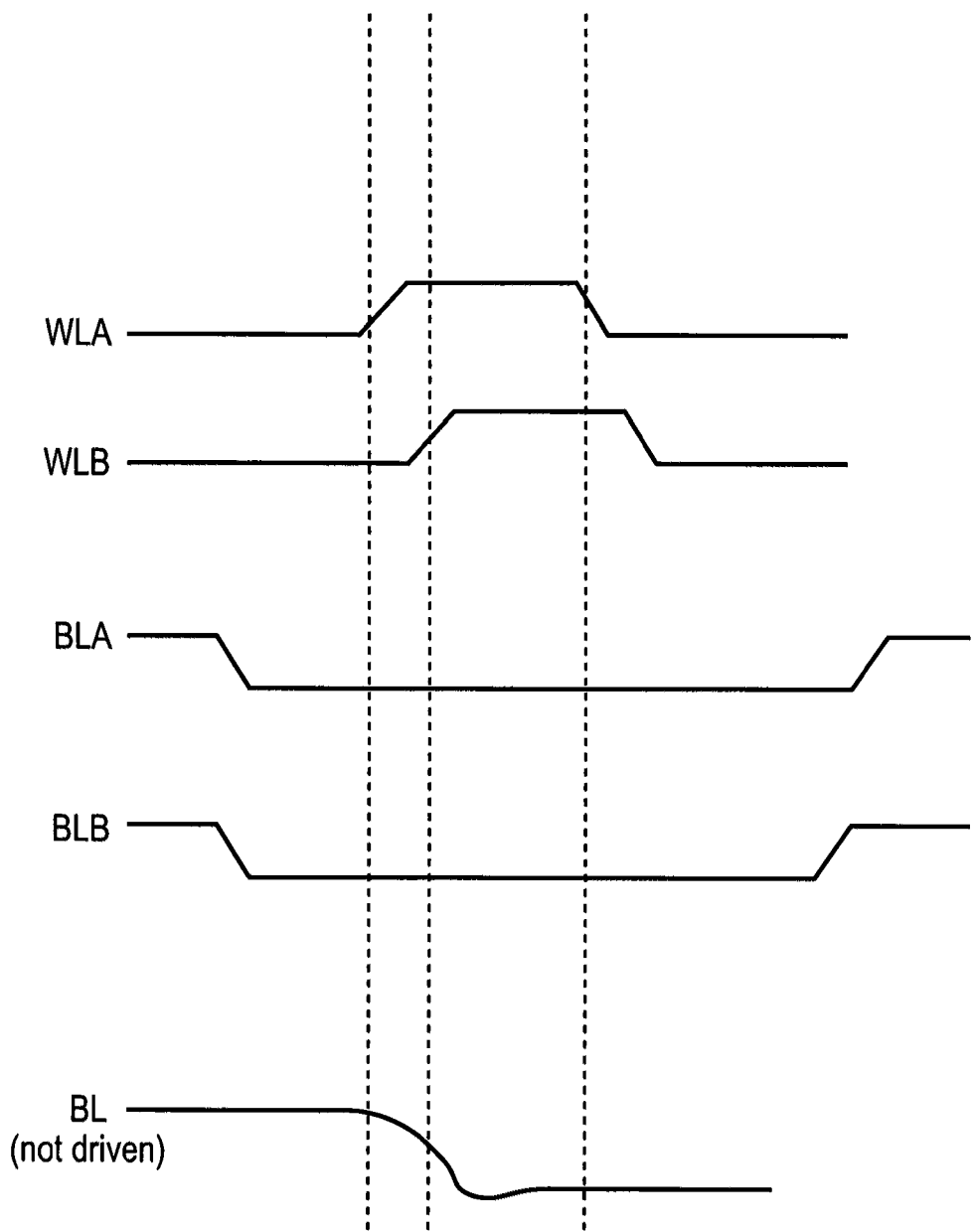
FIG. 3 shows a timing diagram indicating the timing of access control signals in an embodiment of the present invention.

FIG. 3 shows a timing diagram indicating the timing of the signal sent along word line A and word line B of an embodiment of the present invention. The corresponding charge values on bit lines A and bit lines B are also shown. In the case shown the bit lines are both being driven. Alongside them is shown a bit line that is not being driven for a cell that is not being written to. In this case the voltage level falls once the first word line is fired as charge is shared with the cell, when the second word line WLB fires the charge on the bit line has already decayed by a certain amount but now falls again more sharply as there is a new path for charge sharing. The delay in the word lines firing means charge is shared over a longer time period and this reduces the risk of read disturbs.

Figure 4:
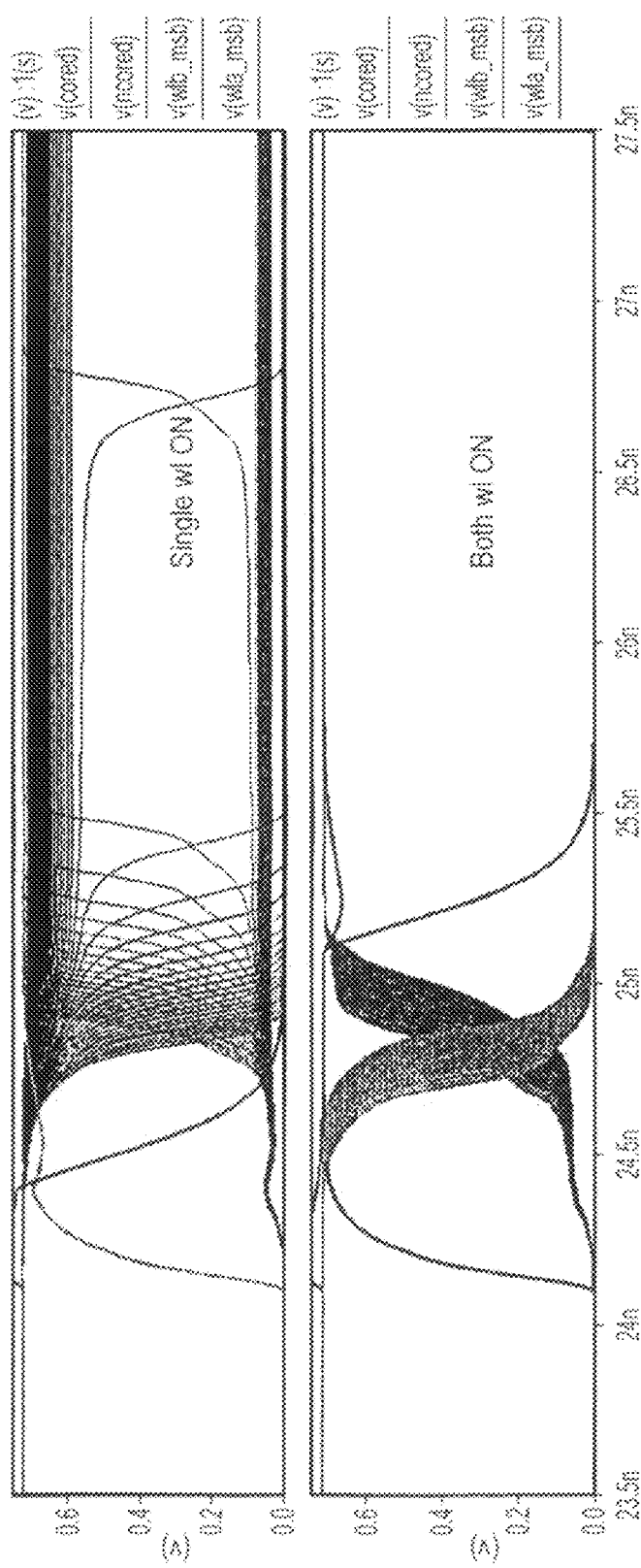
FIG. 4 shows a diagram illustrating the success of write operations using a single port and using the additional port according to an embodiment of the present invention.

FIG. 4 shows examples of data switching in response to one word line being activated with a write request and in response to two word lines being activated at a same time in response to a write request. In this example no delay is provided between the two write requests, and one can see quite clearly that write requests succeed more often when the second word line is used to trigger the pass gates connected to the second data lines BLB.

Figure 5:
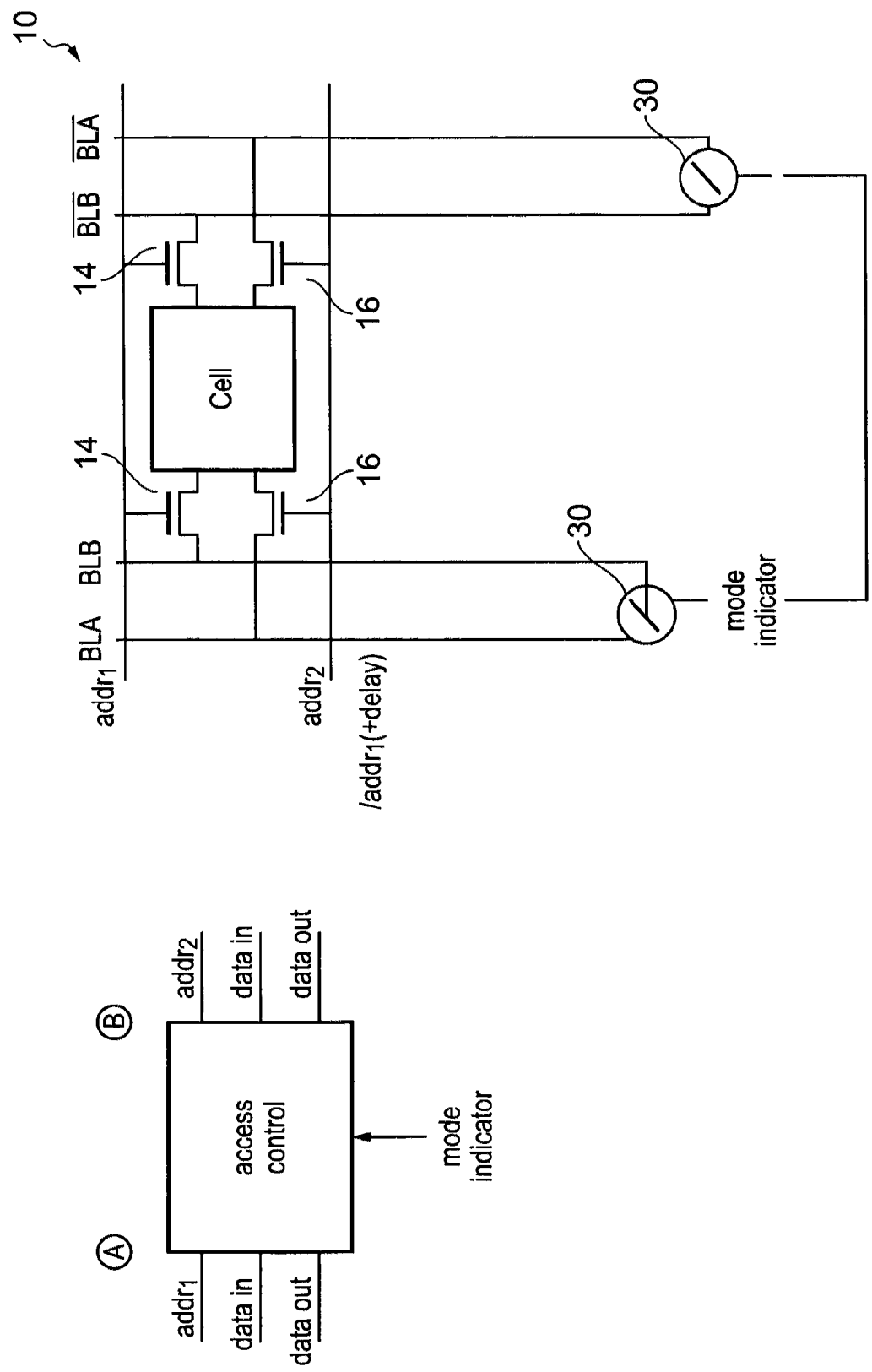
FIG. 5 shows dual port storage cell according to another embodiment of the present invention.

FIG. 5 shows a dual port configuration of an embodiment of the present invention. In this embodiment, data storage cell 10 is configured to operate in dual port mode wherein each storage cell can have two data ports associated with it, one associated with bit line A and one associated with bit line B. Thus, there is a data port that can input data to bit line A and complimentary bit line A and a data port that can input data to bit line B and complimentary bit line B. An access request will include an indication of whether it is to access the data port connected to bit line A or bit line B. This allows two cells in the same row to be accessed in a same cycle via the different ports and data lines. In an embodiment of the present invention if a mode indicator indicates that this storage cell is to operate in single port mode then switching circuitry 30 will connect together the two data lines A and B together in response to a write request and the data for that write request will be loaded onto both data lines. Then when the data is to be written to the cell both word lines will be activated and both pass gates 14 and 16 will provide access to the two data lines and the data will be written. In this mode the advantage of being able to access different cells in the same column in the same cycle is no longer possible as both data lines are used for the one access. However, a write that is more likely to succeed is provided. It may be that in certain modes of operation where perhaps the voltage level is low the system recognises that a write may fail and rather than providing the dual port mode for writing it provides only a single port mode but in this mode the write is assisted and is more likely to succeed. In read operations the dual ports can still be used as the problem associated with the write not succeeding is not associated with a read.

Thus, by providing suitable control circuitry a dual port storage cell can be provided that can be configured in certain modes of operation to be written to as a single port cell but with improved writability, and in other modes can retain its dual port functionality.

Figure 6:
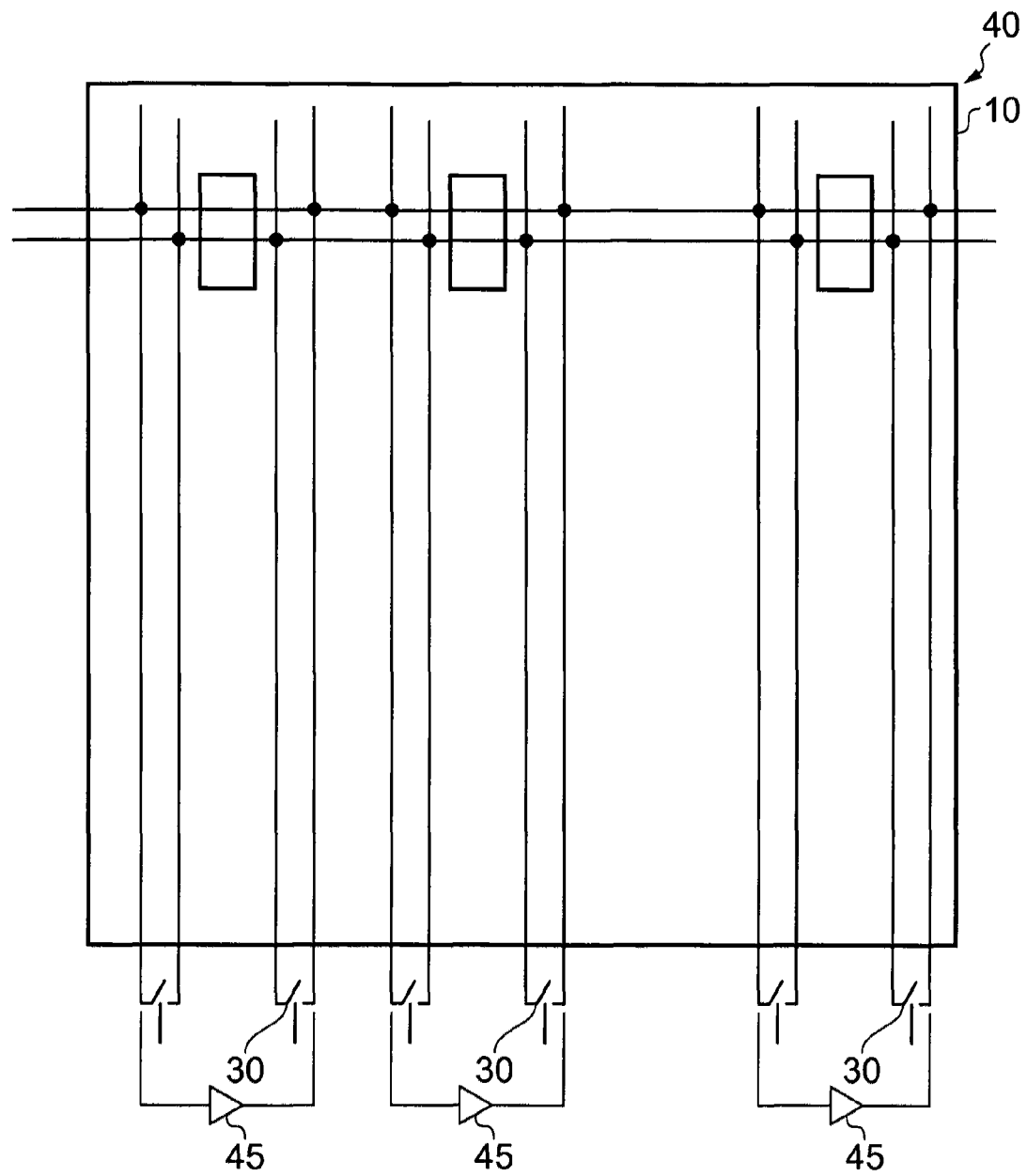
FIG. 6 shows an array of storage cells according to an embodiment of the present invention.

FIG. 6 shows a memory 40 comprising a plurality of storage cells 10 according to an embodiment of the present invention. As can be seen the storage cells 10 are arranged in columns and rows in an array. Each column has two data lines and two complimentary data lines or bit lines and each row has two access or word lines, The data lines are connectable together via a switch 30. During a read access the switch is open and in embodiments such as that of FIGS. 1 and 2 only one of the sets of data lines is precharged and the data is read out using sense amplifier 45.

In the case of dual port embodiment such as shown in FIG. 5 then in the dual port mode of operation and during reads data can be read out from either of the two sets of data lines depending on which of the word lines is activated.

However, during a write in a single port mode in both embodiments, switching circuitry 30 connects the two data lines together and the data value to be written is loaded onto both data lines and both word lines are used to provide access to these data lines. There may in some embodiments be a delay between one of the word lines firing and a subsequent word line firing. This is to provide time for the precharged data lines on the cells not being accessed to discharge before they are connected to these cells thereby reducing the probability of read disturb. However, in other embodiments where high speed performance is important and read disturbs unlikely then the write requests may be fired at the same time.

Figure 7:
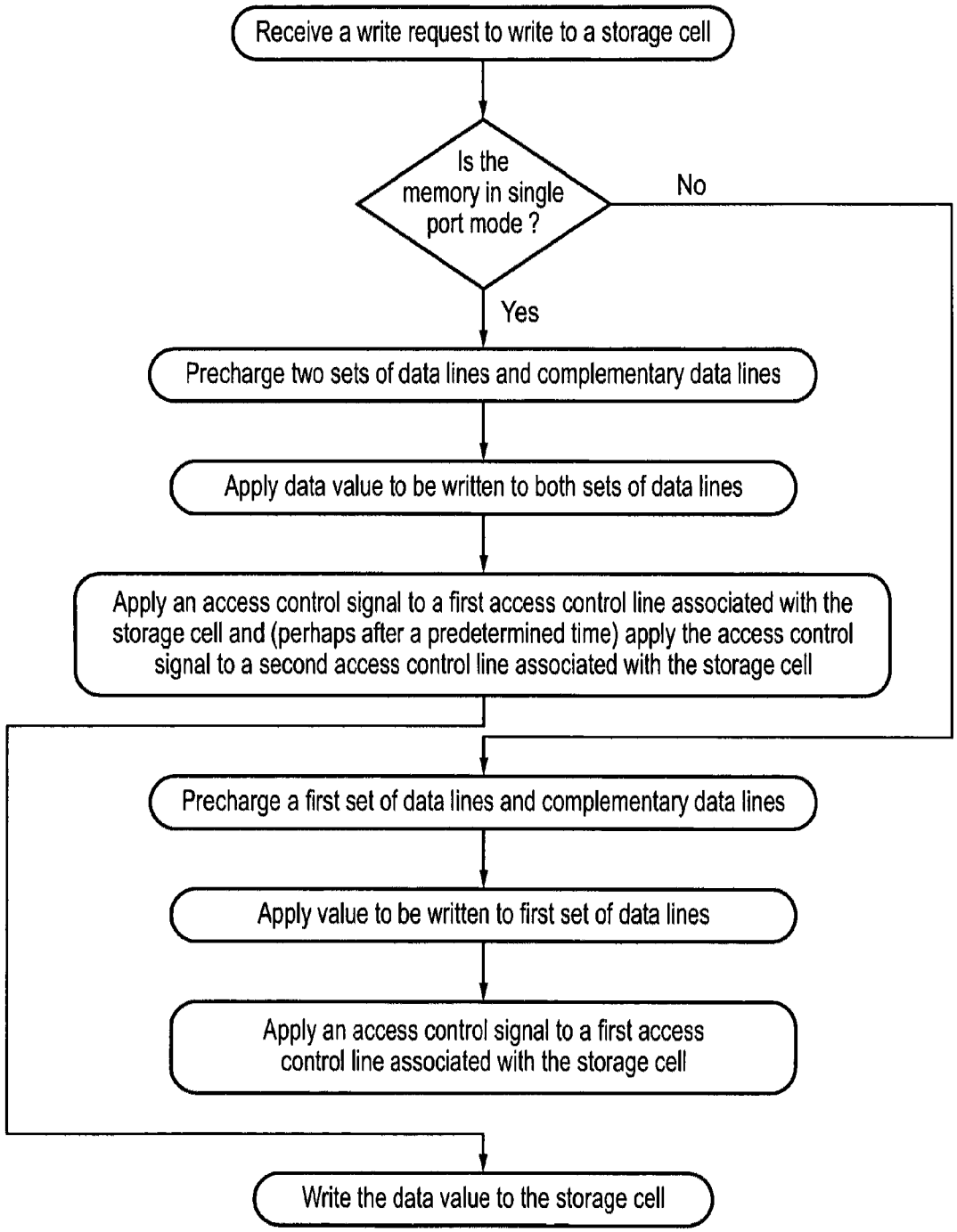
FIG. 7 shows a flow diagram illustrating steps in a method according to an embodiment of the present invention.

FIG. 7 shows a flow diagram illustrating steps in a method according to an embodiment of the present invention.

Initially a write request is received and it is then determined if the memory is in single port mode of operation.

If it is then both sets of data lines and complimentary data lines are precharged and then the data value to be written is applied to both of these sets of data lines. Access control signals are then applied to the first access control line and to the second access control line and then values on the data lines can then be transferred via the access control devices to the storage cell. In some embodiments there is a delay between applying the access signal to the second access control line with respect to the first access control line and this allows the second set of data lines that have been precharged to have the charge they are holding fall to some extent for the cells not being written to, thereby reducing the chance of a read disturb.

In the case that the memory is not in single port mode then only a first set of data lines and complimentary data lines are precharged in this example. In this regard the memory is one where it always operates in single port mode but sometimes does not use both of the data lines where it recognises that writeability is not a problem. Thus, it may be operating in a high voltage regime and precharging both sets of data lines is therefore not required for a successful write and will only consume extra power. Thus, in this case only the first set of data lines and complimentary data lines will be precharged and the data value will be applied to these data lines.

The data value is then written to the storage cell.

In the case of a memory that can operate in dual port mode as well then the lower half of the flow diagram would be similar except that it would be the data line and complimentary data lines that are indicated by the write request that are precharged rather than simply defaulting to the first set. The value to be written would then be applied to these precharged data lines and an access control signal applied to the access control line that provides the storage cell with access to these data lines. The date value would then be written to the storage cell.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A semiconductor memory storage device for storing data comprising:
    a plurality of storage cells, each storage cell comprising at least two access control devices, each of said access control devices providing said storage cell with access to or isolation from a respective one of two data lines in response to an access control signal, said two data lines being connected to at least one data port;
    access control circuitry for applying said access control signal via at least one of two access control lines to control a plurality of said access control devices; wherein
    at least one of said at least two access control devices of each storage cell is controlled by said access control signal received from a first of said two access control lines to provide said storage cell with access to or isolation from a first of said two data lines, and at least one further of said at least two access control devices is controlled by said access control signal received from a second of said two access control lines to provide said storage cell with access to or isolation from a second of said two data lines;
    said access control circuitry is responsive to at least one data access request, said at least one data access request is a write request, to apply a data value to be written to both of said first and second data lines and to apply said access control signal to both of said first and second access control lines, said access control circuitry is responsive to said write request to apply said access control signal to said first of said two access control lines and after a predetermined time delay to apply said access control signal to said second of said two access control lines.

2. A semiconductor memory storage device according to claim 1, wherein said data lines are precharged to a predetermined voltage prior to application of said access control signal, said predetermined time delay is selected in dependence upon a target read stability yield of said memory.

3. A semiconductor memory storage device according to claim 2, comprising switching circuitry for connecting said two data lines to a same data port in response to a single port mode indicator and a write request and to connect said two data lines to two independent data ports in response to at least one of a dual port mode indicator and a read request.

4. A semiconductor memory storage device according to claim 3, wherein said second data line is precharged to a lower predetermined voltage than a predetermined precharged voltage on said first data line, said lower predetermined voltage selected in dependence upon a target read stability yield of said memory.

5. A semiconductor memory storage device according to claim 1, comprising a mode indicator signal input for receiving a mode indicator indicating a mode of operation for said semiconductor memory storage device.

6. A semiconductor memory storage device according to claim 5, comprising switching circuitry for connecting said two data lines to a same data port, said switching device is responsive to receipt of a first mode indicator and a write request to connect said two data lines to said same data port and is responsive to receipt of at least one of a read request and a second mode indicator to isolate said second data line from said same data port.

7. A semiconductor memory storage device according to claim 6, wherein in response to at least one of said read request and said second mode indicator said semiconductor memory storage device is configured not to precharge said second data line and said access control circuitry is configured not to apply said access control signal to said second access control line.

8. A semiconductor memory storage device according to claim 1, wherein at least one of said two data lines are precharged to a predetermined voltage prior to said access control circuitry applying said access control signal.

9. A semiconductor memory storage device according to claim 1, wherein said at least one access control device providing access to said first data line is larger than said at least one access control device providing access to said second data line.

10. A semiconductor memory storage device according to claim 9, wherein said at least one access control device providing access to said first data line is between 5 to 50% larger than said at least one access control device providing access to said second data line.

11. A semiconductor memory storage device according to claim 9, wherein said access control circuitry is responsive to said access control request comprising a read request to apply said read request to said at least one access control device providing access to said first data line and not to apply said read request to said at least one access control device providing access to said second data line.

12. A semiconductor memory storage device according to claim 1, wherein each storage cell comprises a feedback loop and at least four access control devices, at least two of said at least four access control devices providing one side of said feedback loop with access to or isolation from a respective one of two data lines and at least two further of said at least four access control devices providing the other side of said feedback loop with access to or isolation from a respective one of two corresponding complementary data lines, said two data lines being connected to at least one data port and said two complementary data lines being connected to at least one complementary data port;

at least two of said at least four access control devices of each storage cell is controlled by said access control signal applied to a first of said two access control lines to provide said storage cell with access to or isolation from a first of said two data lines and a corresponding first of said two complementary data lines, and at least two further of said at least four access control devices is controlled by said access control signal applied to a second of said two access control lines to provide said storage cell with access to or isolation from a second of said two data lines and a corresponding second of said two complementary data lines.

13. A semiconductor memory storage device according to claim 12, wherein said plurality of storage cells are arranged in at least one array comprising a plurality of rows, a corresponding plurality of two access control lines, a plurality of columns and a corresponding plurality of two data lines and two complementary data lines.

14. A computer program product comprising a non-transitory computer readable storage medium including a computer program which when executed on a computer causes said computer to generate a layout for a memory according to claim 1.

15. A method of storing data in a storage cell within a semiconductor memory storage device comprising the following steps:
receiving a write request to write a data value;
applying said data value to two data lines;
applying an access control signal to a first of two access control lines to control a plurality of access control devices connected to said first of said two access control lines to each provide an associated storage cell with access to a first of said two data lines; and
applying said access control signal to said second of said two access control lines to control a plurality of access control devices connected to said second of said two access control lines to each provide an associated storage cell with access to a second of said two data lines, wherein said step of applying said access control signal to said second of said two access control lines is performed a predetermined time delay after said step of applying said access control signal to said first of said two access control lines.

16. A computer program product comprising a computer program which when executed on a program causes said program to generate a layout for a storage cell, said storage cell comprising:
a feedback loop;
at least two access control devices, each of said access control devices being configured for providing said feedback loop with access to or isolation from a respective one of two data lines in response to an access control signal;
at least two inputs for receiving an access control signal at least one of said at least two access control devices being controlled by said access control signal received at a first of said two inputs, and at least one further of said at least two access control devices is controlled by said access control signal received at a second of said two inputs; wherein
said at least one of said access control devices controlled by said access control signal received at said first input is larger than said at least one of said access control devices controlled by said access control signal received at said second input; and
said access control circuitry is responsive to said write request to apply said access control signal to said first of said two access control lines and after a predetermined time delay to apply said access control signal to said second of said two access control lines.

17. A semiconductor memory means for storing data comprising:
- a plurality of storage cell means for storing data items, each storage cell means comprising at least two means for providing access, each of said means for providing access providing said storage cell means with access to or isolation from a respective one of two data lines in response to an access control signal, said two data lines being connected to at least one data port;
- access control means for applying said access control signal via at least one of two access control lines to control a plurality of said means for providing access; wherein
- at least one of said at least two means for providing access of each storage cell means is controlled by said access control signal received from a first of said two access control lines to provide said storage cell means with access to or isolation from a first of said two data lines, and at least one further of said at least two means for providing access is controlled by said access control signal received from a second of said two access control lines to provide said storage cell means with access to or isolation from a second of said two data lines;
- said access control means is responsive to at least one data access request, said at least one data access request being a write request, for applying a data value to be written to both of said first and second data lines and to apply said access control signal to both of said first and second access control lines; and
- said access control means is responsive to said write request to apply said access control signal to said first of said two access control lines and after a predetermined time delay to apply said access control signal to said second of said two access control lines.

* * * * *